(12) United States Patent
Ueda et al.

(10) Patent No.: US 8,119,241 B2
(45) Date of Patent: Feb. 21, 2012

(54) METHOD FOR MANUFACTURING DIAMOND MONOCRYSTAL HAVING A THIN FILM, AND DIAMOND MONOCRYSTAL HAVING A THIN FILM

(75) Inventors: Akihiko Ueda, Hyogo (JP); Kiichi Meguro, Hyogo (JP); Yoshiyuki Yamamoto, Hyogo (JP); Yoshiki Nishibayashi, Hyogo (JP); Takahiro Imai, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 756 days.

(21) Appl. No.: 12/282,137

(22) PCT Filed: Dec. 26, 2007

(86) PCT No.: PCT/JP2007/074996
§ 371 (c)(1),
(2), (4) Date: Sep. 8, 2008

(87) PCT Pub. No.: WO2008/066209
PCT Pub. Date: Jun. 5, 2008

(65) Prior Publication Data
US 2009/0169814 A1  Jul. 2, 2009

(51) Int. Cl.
*C30B 29/04* (2006.01)
(52) U.S. Cl. ............. 428/408; 117/88; 117/94; 427/577
(58) Field of Classification Search .................. 428/408; 427/577; 117/88, 94
See application file for complete search history.

(56) References Cited

U.S. PATENT DOCUMENTS

| | | | |
|---|---|---|---|
| 5,961,717 A | 10/1999 | Kamo et al. | |
| 7,063,742 B1 * | 6/2006 | Ando et al. | 117/94 |
| 7,524,372 B2 * | 4/2009 | Meguro et al. | 117/94 |
| 2008/0193366 A1 * | 8/2008 | Kato et al. | 117/88 |

FOREIGN PATENT DOCUMENTS

| | | |
|---|---|---|
| EP | 1 179 621 A1 | 2/2002 |
| JP | H01-103993 A | 4/1989 |
| JP | H10-081587 A | 3/1998 |
| JP | 2005-162525 A | 6/2005 |
| JP | 2006-240983 A | 9/2006 |
| JP | 2006-303131 A | 11/2006 |
| JP | 2006-306701 A | 11/2006 |

OTHER PUBLICATIONS

Akihiko Namba et al., "Synthesis of Phosphorus-Doped Diamond Semiconductor and application to Electron Emitters", SEI Technical Review, Journal, Mar. 2005, pp. 38-44, No. 166, Japan.

(Continued)

*Primary Examiner* — Archene Turner
(74) *Attorney, Agent, or Firm* — Global IP Counselors, LLP (57) ABSTRACT

A method for growing a low-resistance phosphorus-doped epitaxial thin film having a specific resistance of 300 Ωcm or less at 300 K on a principal surface of a {111} monocrystal substrate under conditions in which the phosphorus atom/carbon atom ratio is 3% or higher, includes the principal surface having an off-angle of 0.50° or greater. The diamond monocrystal having a low-resistance phosphorus-doped diamond epitaxial thin film is such that the thin-film surface has an off-angle of 0.50° or greater with respect to the {111} plane, and the specific resistance of the low-resistance phosphorus-doped diamond epitaxial thin film is 300 Ωcm or less at 300 K.

10 Claims, 3 Drawing Sheets

OTHER PUBLICATIONS

Takatoshi Yamada et al., "Field emission from H- and O-terminated heavily P-doped homoepitaxial diamond", J. Vac. Sci. Technol. B24 (2), Mar./Apr. 2006, pp. 967-970.

Kato et al., "Growth and characterization of phosphorus-doped diamond using organophosphorus gases", Phys. Stat. Sol. 202, No. 11, pp. 2122-2128, 2005.

Spitsyn et al., "Chemical Crystallization of Diamond and the Diamond Coating Deposition from Gas Phase", Protection of Metals, vol. 43, No. 5, pp. 415-431, 2007.

Korean Office Action in corresponding Korean Patent Application No. 10-2008-7019971 dated Jul. 8, 2010.

Extended European Search Report of the corresponding European Application No. 07860225.7, dated Apr. 8, 2011.

* cited by examiner

METHOD FOR MANUFACTURING DIAMOND MONOCRYSTAL HAVING A THIN FILM, AND DIAMOND MONOCRYSTAL HAVING A THIN FILM

TECHNICAL FIELD

The present invention relates to a method for manufacturing a diamond monocrystal having a phosphorus-doped diamond epitaxial thin film, and to a diamond monocrystal having a phosphorus-doped diamond epitaxial thin film.

BACKGROUND ART

Diamond as a semiconductor material has an extremely large band gap of 5.5 eV, and a high carrier mobility of 2000 $cm^2/V \cdot s$ at room temperature for both electrons and positive holes. The dielectric constant is also small, being 5.7, and the breakdown field is high, being $5 \times 10^6$ V/cm. Furthermore, diamond also has the rare characteristic of negative electron affinity in which the vacuum level exists below the lower end of the conduction band. Because of such excellent characteristics, diamond has potential applications as a material for semiconductor devices such as environment-resistant devices that operate in high-temperature environments or space environments, power devices capable of high-frequency and high-output operation, luminescent devices capable of emitting ultraviolet light, or electron emission devices capable of low-voltage operation.

A p-type semiconductor can be fabricated by doping diamond with boron. The method disclosed in Japanese Laid-Open Patent Application No. 10-081587 for doping with phosphorus makes it possible to reliably fabricate an n-type semiconductor. However, the acceptor level of 0.37 eV formed by boron doping, and the donor level of 0.57 eV formed by phosphorus doping are low compared to a silicon semiconductor or the like, and the resistance at room temperature (300 K) is high. Typically, the specific resistance at 300 K is about $10^5$ Ωcm when the activation energy near room temperature is approximately 0.6 eV as calculated from the temperature dependence of the carrier concentration in phosphorus-doped diamond. Therefore, a method such as the one disclosed in *J. Vac. Technol.* B 24(2) p. 967 (2006), for example, is attempted, whereby the specific resistance is lowered to 5 to $8 \times 10^2$ Ωcm by doping with phosphorus to a high concentration of 5 to $7 \times 10^{19}$ $cm^{-3}$, and using the product as an electron emitting material.

DISCLOSURE OF THE INVENTION

Problems to Be Solved by the Invention

Phosphorus-doped diamond is currently obtained only through epitaxial vapor-phase growth on a diamond monocrystal substrate by a microwave or DC plasma CVD method. A high-concentration-phosphorus-doped diamond epitaxial thin film has electrons as the carrier thereof and relatively low specific resistance, and therefore has potential demand as an electron emitting material such as described above. Management of the specific resistance of the thin film is critical when diamond monocrystals provided with phosphorus-doped epitaxial thin films are mass produced. A high-concentration-phosphorus-doped diamond thin film (phosphorus concentration $\geq 5 \times 10^{19}$ $cm^{-3}$) is obtained only on a diamond monocrystal (hereinafter referred to as a {111} monocrystal substrate) in which the primary surface has an off-plane with respect to the {111} just plane. Since the {111} just plane of a diamond is extremely hard, and mechanical grinding thereof is almost impossible, a substrate in which the principal surface is created by grinding to create an off-angle of a certain degree is used as the {111} monocrystal substrate. However, the angle or surface roughness thereof fluctuates due to the difficulty of grinding. Therefore, even when high-concentration-phosphorus-doped diamond thin films are synthesized under the same vapor-phase growth conditions on a plurality of {111} monocrystal substrates, the doping efficiency [the phosphorus atom/carbon atom ratio (phosphorus concentration) in the thin film with respect to the phosphorus atom/carbon atom ratio in the source gas] varies according to the differences in off-angle or surface roughness. As a result, problems occur in that the specific resistance of the thin films and the phosphorus concentration in the thin films fluctuate widely between test samples.

The present invention was developed to overcome the problems described above, and an object of the present invention is to provide a diamond monocrystal having a low-resistance phosphorus-doped diamond epitaxial thin film, and a method for manufacturing a diamond monocrystal having a low-resistance phosphorus-doped diamond epitaxial thin film in which there is minimal fluctuation of specific resistance between test samples, and phosphorus is doped to a high concentration. More specifically, an object of the present invention is to provide a diamond monocrystal having a low-resistance phosphorus-doped diamond epitaxial thin film, and a method for manufacturing a diamond monocrystal having a low-resistance phosphorus-doped diamond epitaxial thin film having minimal fluctuation of specific resistance between test samples, through the use of a {111} monocrystal substrate having limited off-angle or surface roughness, and the application of a range of vapor-phase synthesis conditions whereby a low-resistance thin film is obtained.

Means Used to Solve the Above-Mentioned Problems

In order to overcome the abovementioned problems, the method for manufacturing a diamond monocrystal having a low-resistance phosphorus-doped diamond epitaxial thin film according to the present invention is a method for the vapor-phase growth of a low-resistance phosphorus-doped epitaxial thin film having a specific resistance of 300 Ωcm or less at 300 K on a principal surface of a diamond monocrystal substrate; and the method is characterized in that the principal surface of the diamond monocrystal substrate has an off-angle of 0.50° or greater with respect to a {111} plane, and the content of phosphorus atoms in a source gas of vapor-phase growth is 3% or more of the content of carbon atoms. The use of microwaves or a DC plasma CVD method is suitably for the vapor-phase growth.

The method for manufacturing a diamond monocrystal having a low-resistance phosphorus-doped diamond epitaxial thin film according to the present invention is also a vapor-phase growth method of a low-resistance phosphorus-doped epitaxial thin film having a specific resistance of 100 Ωcm or less at 300 K on a principal surface of a diamond monocrystal substrate. The method is characterized in that the principal surface of the diamond monocrystal substrate has an off-angle of 0.50° or greater with respect to a {111} plane, a normal vector to the principal surface is tilted to an orientation within 40° from a [110] direction with respect to the normal vector to the {111} plane, and the content of phosphorus atoms in a source gas of vapor-phase growth is 3% or more of the content of carbon atoms. In this instance, the term "normal vector" refers to a unit vector perpendicular to the surface and is oriented in the front direction of the surface. The use of microwaves or a DC plasma CVD method is suitably for the vapor-phase growth.

The method for manufacturing a diamond monocrystal having a low-resistance phosphorus-doped diamond epitaxial thin film according to the present invention is also a vapor-phase growth method of a low-resistance phosphorus-doped epitaxial thin film having a specific resistance of 100 Ωcm or less at 300 K on a principal surface of a diamond monocrystal substrate. The method is characterized in that the principal surface of the diamond monocrystal substrate has an off-angle of 0.50° or greater with respect to a {111} plane, a normal vector to the principal surface is tilted to an orientation within 40° from a [211] direction with respect to the normal vector to the {111} plane, and the content of phosphorus atoms in a source gas of vapor-phase growth is 3% or more of the content of carbon atoms. The use of microwaves or a DC plasma CVD method is suitably for the vapor-phase growth.

Alternatively, the method for manufacturing a diamond monocrystal having a low-resistance phosphorus-doped diamond epitaxial thin film according to the present invention is preferably a method for using microwaves or a DC plasma CVD method to grow a low-resistance phosphorus-doped diamond epitaxial thin film, wherein the surface roughness of the diamond monocrystal substrate is 10 nm or higher. The term "surface roughness" refers to the arithmetic average roughness (Ra) of the principal surface.

The diamond monocrystal having a low-resistance phosphorus-doped diamond epitaxial thin film according to the present invention is characterized in that the principal surface of the low-resistance phosphorus-doped diamond epitaxial thin film has an off-angle of 0.500 or greater with respect to a {111} plane, and a specific resistance of the low-resistance phosphorus-doped diamond epitaxial thin film is 300 Ωcm or less at 300 K. The phosphorus concentration of the low-resistance phosphorus-doped diamond epitaxial thin film is preferably $5.0 \times 10^{19}$ cm$^{-3}$ or higher.

Alternatively, the diamond monocrystal having a low-resistance phosphorus-doped diamond epitaxial thin film according to the present invention is characterized in that the principal surface of the low-resistance phosphorus-doped diamond epitaxial thin film has an off-angle of 0.50° or greater with respect to a {111} plane, a normal vector to the low-resistance phosphorus-doped diamond epitaxial thin film is tilted to an orientation within 40° from a [110] direction with respect to the normal vector to the {111} plane, and a specific resistance of the low-resistance phosphorus-doped diamond epitaxial thin film is 100 Ωcm or less at 300 K. The phosphorus concentration of the low-resistance phosphorus-doped diamond epitaxial thin film is preferably $8.6 \times 10^{19}$ cm$^{-3}$ or higher.

The diamond monocrystal having a low-resistance phosphorus-doped diamond epitaxial thin film according to the present invention is also characterized in that the principal surface of the low-resistance phosphorus-doped diamond epitaxial thin film has an off-angle of 0.50° or greater with respect to a {111} plane, a normal vector to the low-resistance phosphorus-doped diamond epitaxial thin film is tilted to an orientation within 40° from a [211] direction with respect to the normal vector to the {111} plane, and a specific resistance of the low-resistance phosphorus-doped diamond epitaxial thin film is 100 Ωcm or less at 300 K. The phosphorus concentration of the low-resistance phosphorus-doped diamond epitaxial thin film is preferably $8.6 \times 10^{19}$ cm$^{-3}$ or higher.

Furthermore, in the diamond monocrystal having a low-resistance phosphorus-doped diamond epitaxial thin film according to the present invention, the thin-film surface preferably has a surface roughness of 10 nm or higher.

Effect of the Invention

The diamond monocrystal having a low-resistance phosphorus-doped diamond epitaxial thin film, and the method for manufacturing a diamond monocrystal having a low-resistance phosphorus-doped diamond epitaxial thin film according to the present invention make it possible to provide a diamond monocrystal having a low-resistance phosphorus-doped diamond epitaxial thin film, and a method for manufacturing a diamond monocrystal having a low-resistance phosphorus-doped diamond epitaxial thin film having minimal fluctuation of specific resistance, through the use of a {111} monocrystal substrate having prescribed off-angle, and the application of a prescribed range of vapor-phase synthesis conditions.

The diamond monocrystal having a low-resistance phosphorus-doped diamond epitaxial thin film according to the present invention has low resistance and minimal fluctuation of specific resistance, and can therefore be applied as a material used in environment-resistant devices that operate in high-temperature environments or space environments, power devices capable of high-frequency and high-output operation, luminescent devices capable of emitting ultraviolet light, electron emission devices capable of low-voltage operation, or other semiconductor devices/electronic devices.

KEY TO SYMBOLS

10: monocrystal substrate
11: monocrystal substrate principal surface
20: phosphorus-doped diamond epitaxial thin filmed diamond monocrystal
21: phosphorus-doped diamond epitaxial thin film

PREFERRED EMBODIMENTS OF THE INVENTION

Preferred embodiments of the method for manufacturing a diamond monocrystal having a low-resistance phosphorus-doped diamond epitaxial thin film, and the diamond monocrystal having a phosphorus-doped diamond epitaxial thin film according to the present invention will be described in detail hereinafter with reference to the accompanying drawings. In the descriptions of the drawings, the same reference symbols are used to refer to elements that are the same in each drawing, and description of such elements will not be repeated. The dimensional ratios shown in the drawings are schematic do not necessarily correspond to specific dimensions set forth in the following description.

Figure 1:
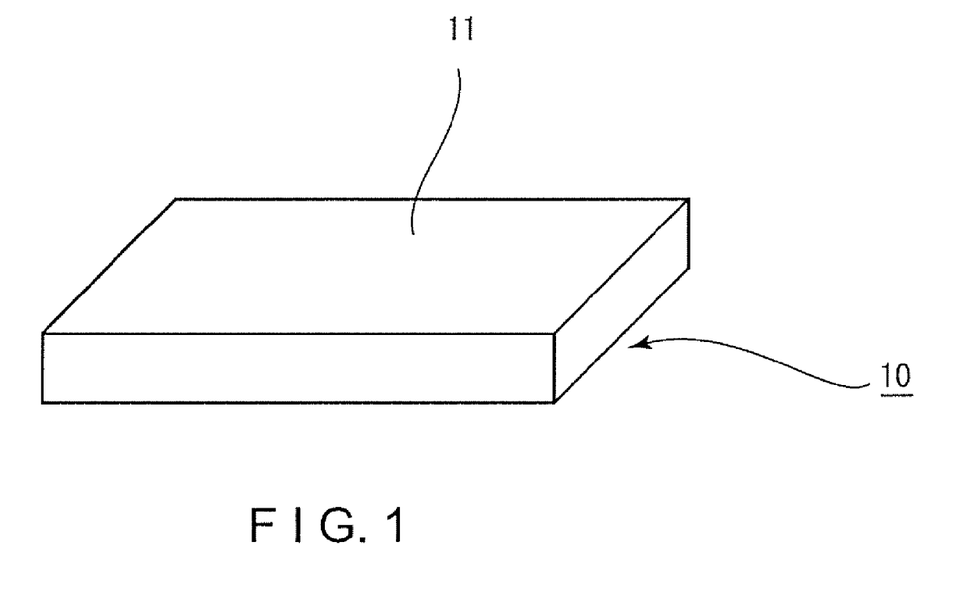
FIG. 1 is a perspective view showing the diamond monocrystal substrate.

FIG. 1 is a perspective view showing the diamond {111} monocrystal substrate used in the present invention. The diamond {111} monocrystal substrate 10 has as the principal surface 11 a surface having an off-angle with respect to the {111} plane. The principal surface 11 is a mechanically ground surface. Since the {111} just plane of a diamond is extremely hard, and mechanical grinding thereof is almost impossible, a substrate in which the principal surface is created by grinding to create an off-angle of a certain degree is used as the {111} monocrystal substrate. A {111} monocrystal substrate having a principal surface at an off-angle of 0.50° or higher is used in the present invention. Having an off-angle of 0.5° or higher makes it possible to stably manufacture a low-resistance phosphorus-doped diamond epitaxial thin film having a specific resistance of 300 Ωcm at 300 K. Such low resistance cannot be obtained when the off-angle is less than 0.5°. When the off-angle is greater then 5°, the n-type characteristics essential for application as a semiconductor device are lost. Consequently, the {111} monocrystal substrate that is preferred for use has a principal surface at an off-angle of less than 5° and not less than 0.5°.

Due to the difficulty of mechanical grinding, the principal surface 11 of the diamond {111} monocrystal substrate 10 has a certain degree of surface roughness (arithmetic average roughness; Ra). The surface roughness can be measured by a pin-type surface roughness meter or an atomic force microscope (AFM). In the present invention, since it is difficult to measure the surface roughness of the entire area of the principal surface 11, the surface roughness in the vicinity of the center of the principal surface is used as the surface roughness of the substrate. A {111} monocrystal substrate whose principal surface has a surface roughness of 10 nm or greater may be used in the present invention. By selecting a surface roughness of 10 nm or greater for the principal surface, the number of sites such as steps or kinks in which phosphorus atoms are easily incorporated increases, resulting in enhanced efficiency of phosphorus uptake into the thin film during vapor-phase growth. As a result, a low-resistance phosphorus-doped diamond epitaxial thin film having lower specific resistance at 300 K and a thin-film surface roughness of 10 nm or greater can be even more stably manufactured. Since the low-resistance phosphorus-doped epitaxial thin film grown on the diamond {111} monocrystal substrate is doped with a high concentration of phosphorus, cleavage (cracking) can easily occur. The maximum film thickness thereof is therefore limited to 20 μm. At such a small thickness, the surface roughness of the thin film is substantially the same as the surface roughness of the principal surface. When the surface roughness of the principal surface is less than 10 nm, the uptake efficiency decreases, and the resistance is sometimes not adequately low. When the surface roughness of the principal surface is greater than 100 nm, the surface roughness of the thin film becomes greater than 100 nm, and significant problems occur in that the desired shape cannot be fabricated in the semiconductor device manufacturing process, particularly the microfabrication process. Consequently, the principal surface of the {111} monocrystal substrate that is preferred for use has a surface roughness of less than 100 nm and not less than 10 nm. A surface roughness of 10 nm or greater and 50 nm or less is more preferred, and the specific resistance at 300 K can be reduced in this range. This range also virtually eliminates problems in the microfabrication process.

Any of the following can be used as the diamond {111} monocrystal substrate of the present invention: a monocrystal synthesized by a high-temperature high-pressure method, a monocrystal synthesized by a vapor-phase growth method, and a naturally occurring monocrystal. Nitrogen, boron, or another impurity may be present in the diamond {111} monocrystal substrate. Examples of the size of monocrystal used include a thickness of 0.3 mm and a principal surface 2 mm×2 mm, and a thickness of 0.3 mm and a principal surface 1.5 mm×2.0 mm, but these sizes are not limiting.

Figure 2:
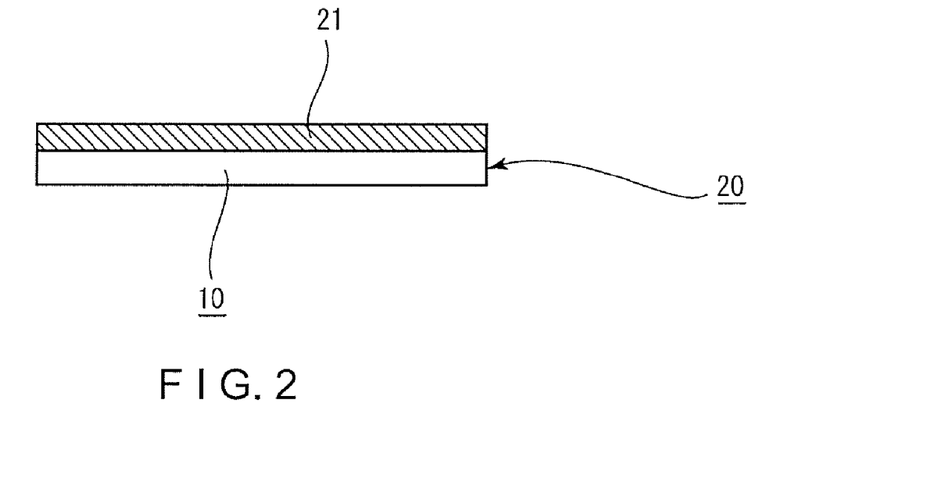
FIG. 2 is a sectional view showing the diamond monocrystal having a low-resistance phosphorus-doped diamond epitaxial thin film according to the present invention.

FIG. 2 is a sectional view showing the diamond monocrystal having a low-resistance phosphorus-doped diamond epitaxial thin film according to the present invention. The low-resistance phosphorus-doped diamond epitaxial thin-filmed diamond monocrystal 20 is composed of a low-resistance phosphorus-doped diamond epitaxial thin film 21 and the diamond {111} monocrystal substrate 10. The low-resistance phosphorus-doped diamond epitaxial thin film 21 is synthesized by microwaves or a DC plasma CVD method. Prior to synthesis, the mechanically ground surface that is the principal surface 11 of the diamond {111} monocrystal substrate 10 is preferably subjected to mechanical grinding by reactive ion etching (RIE) or the like as a pre-process to remove the damage layer. Since the damage layer is 0.1 to 0.5 μm, and sometimes 1.0 to 1.5 μm, the damage layer is removed. The principal surface is also preferably cleaned by ultrasonic cleaning, acid treatment, or the like using an organic solvent or purified water. The crystallinity of the low-resistance phosphorus-doped diamond epitaxial thin film 21 is thereby enhanced, and as a result, fluctuation in the specific resistance can be further reduced. There are almost no differences in off-angle or surface roughness after mechanical grinding and the aforementioned pre-processing even when a damage layer of about 1.5 μm is removed, but the off-angle or surface roughness of the present invention indicate the off-angle or surface roughness after the aforementioned pre-processing.

The pre-processed diamond {111} monocrystal substrate 10 is transported to a plasma CVD device, and the low-resistance phosphorus-doped diamond epitaxial thin film 21 is synthesized on the principal surface 11. Hydrogen ($H_2$), methane ($CH_4$), and phosphine ($PH_3$), for example, are suitable as source gases. A hydrocarbon gas other than methane may also be used. TBP (tri-n butyl phosphate), TMP (trimethylphosphate), or the like may also be used besides phosphine.

A gas mixture of hydrogen, methane, and phosphine is introduced with microwaves or a high direct-current voltage (DC) into the plasma CVD device, and plasma is generated, whereby the source gas is activated, and an epitaxial thin film is deposited on the principal surface 11 of the diamond {111} monocrystal substrate 10. The source gas ratio in the gas mixture is preferably set so that the methane gas flow rate/hydrogen gas flow rate ratio=0.01 to 1%, and the phosphine gas flow rate/methane gas flow rate ratio=3 to 20%, i.e., the phosphorus atom/carbon atom ratio in the gas mixture is preferably 3% or higher and 20% or lower. A methane gas flow rate/hydrogen gas flow rate ratio of less than 0.01% is not preferred, because the growth rate of the epitaxial thin film is almost zero. When this flow rate ratio is greater than 1%, the crystallinity of the epitaxial thin film rapidly deteriorates, and a thin film having the intended specific resistance is difficult to obtain. A phosphine gas flow rate/methane gas flow rate ratio of less than 3% is unsuitable because the decreased number of phosphorus atoms mixed into the thin film causes the specific resistance to be higher than 300 Ωcm. When this flow rate ratio is greater than 20%, the crystallinity of the epitaxial thin film rapidly deteriorates, and a thin film having the intended specific resistance is difficult to obtain. A suitable pressure of the gas mixture during synthesis is $2.6 \times 10^3$ Pa to $2.6 \times 10^4$ Pa, and a suitable substrate temperature for the diamond {111} monocrystal substrate 10 is 600 to 1200° C. Outside these pressure and temperature ranges, the crystallinity of the obtained thin film deteriorates, or the thin film is difficult to grow.

After removal of the surface conduction layer formed by hydrogen termination of the thin-film surface immediately after synthesis of the obtained low-resistance phosphorus-doped diamond epitaxial thin film 21, the specific resistance is measured by the four-point probe method, the van der Pauw method, or another method. When the van der Pauw method is used, a Ti/Pt/Au laminate structure is preferably used as the electrode metal. Substantially ohmic contact is obtained with the low-resistance phosphorus-doped diamond epitaxial thin film 21. In order to compute the specific resistance, the thickness of the thin film 21 must also be measured in addition to performing the measurement described above. The film thickness can be calculated by measuring the profile in the depth direction of the phosphorus concentration in the thin film by secondary ion mass spectrometry (SIMS), and determining the boundary with the substrate 10.

When the thin film is synthesized under the aforementioned synthesis conditions, the off-angle of the principal surface 11 is selected from 0.5° and higher, and a low-resistance phosphorus-doped diamond epitaxial thin film 21 is obtained in which the off-angle of the surface is 0.50 or higher, and the specific resistance is 300 Ωcm or lower at 300 K. Furthermore, by selecting the surface roughness of the principal surface 11 from 10 nm or greater, a thin film 21 is obtained in which the surface roughness is 10 nm or greater, and the resistance is lower than when the surface roughness is less than 10 nm. Since the low-resistance phosphorus-doped epitaxial thin film grown on the diamond {111} monocrystal substrate is doped with a high concentration of phosphorus, cleavage (cracking) can easily occur. Consequently, the maximum film thickness is limited to 20 μm, and there is therefore almost no difference in off-angle or surface roughness between the principal surface and the thin-film surface. Since the temperature dependence of the specific resistance decreases in such a thin film in which the specific resistance is 300 Ωcm or lower, the thin film can be suitably used as a material for a device that is operated at high temperatures.

When the thin film is synthesized under the aforementioned synthesis conditions, by selecting the off-angle of the principal surface 11 from angles of 0.50 or greater, a high-concentration doped thin film 21 is obtained in which the off-angle of the surface is 0.5° or greater, and the phosphorus concentration in the thin film is $5.0 \times 10^{19}$ cm$^{-3}$ or higher. Furthermore, by selecting the surface roughness of the principal surface 11 from values of 10 nm or higher, a thin film 21 can be obtained that has a surface roughness of 10 nm or higher and is doped to a higher concentration. A diamond monocrystal 20 provided with a low-resistance phosphorus-doped diamond epitaxial thin film 21 having a specific resistance of 300 Ωcm or less by high-concentration doping at a phosphorus concentration of $5.0 \times 10^{19}$ cm$^{-3}$ or higher can be obtained without fluctuation only when the off-angle condition of the principal surface 11 is coordinated in addition to the aforementioned synthesis conditions.

In the past, a low-resistance phosphorus-doped diamond epitaxial thin film having a specific resistance of 300 Ωcm or less has sometimes not been obtained even when synthesis was carried out under the same conditions. The range of fluctuation of the specific resistance in each resulting thin film has also been $10^1$ to $10^5$ Ωcm, or five orders of magnitude. However, process yield and other productive techniques have not been regarded as problems at the laboratory level. The inventors have learned that a product having a low specific resistance at 300 K is easy to use, and therefore has excellent characteristics as an electron emitting material in comparison to a phosphorus-doped diamond epitaxial thin film that is doped to a relatively low concentration. Therefore, the inventors first recognized the problem of process yield upon investigating the mass production of a diamond monocrystal having a low-resistance phosphorus-doped diamond epitaxial thin film. As a result of concentrated investigation, the inventors discovered that fluctuation in specific resistance under the same synthesis conditions is almost solely caused by fluctuation of the off-angle of diamond {111} monocrystal substrates. The inventors also discovered that thin films having almost no fluctuation and a specific resistance of 300 Ωcm or less are obtained by synthesizing a phosphorus-doped diamond epitaxial thin film using a phosphorus atom/carbon atom ratio of 3% or higher in the vapor phase using a diamond {111} monocrystal substrate in which the off-angle of the principal surface is 0.50° or greater.

The density of steps or kinks in the monocrystal surface varies according to the orientation of the off-angle of the principal surface. Accordingly, the specific resistance should also fluctuate according to the orientation of the off-angle of the principal surface. The inventors postulated that if fluctuation of the orientation can be suppressed, then even lower resistance can be obtained, and fluctuation of the specific resistance can be suppressed.

Figure 3A:
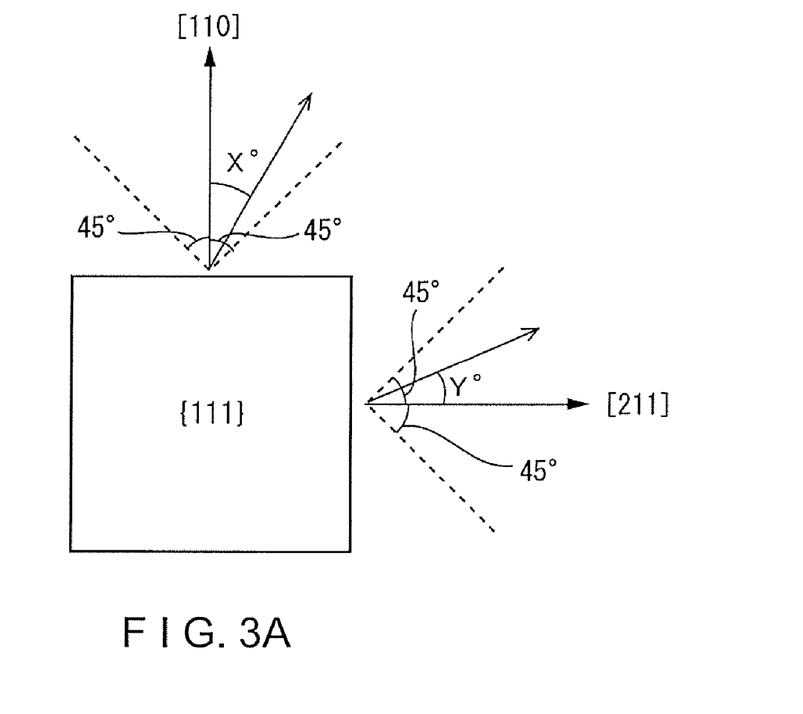
FIG. 3A is a diagram showing the tilt with respect to the normal vector to the {111} plane.
Figure 3B:
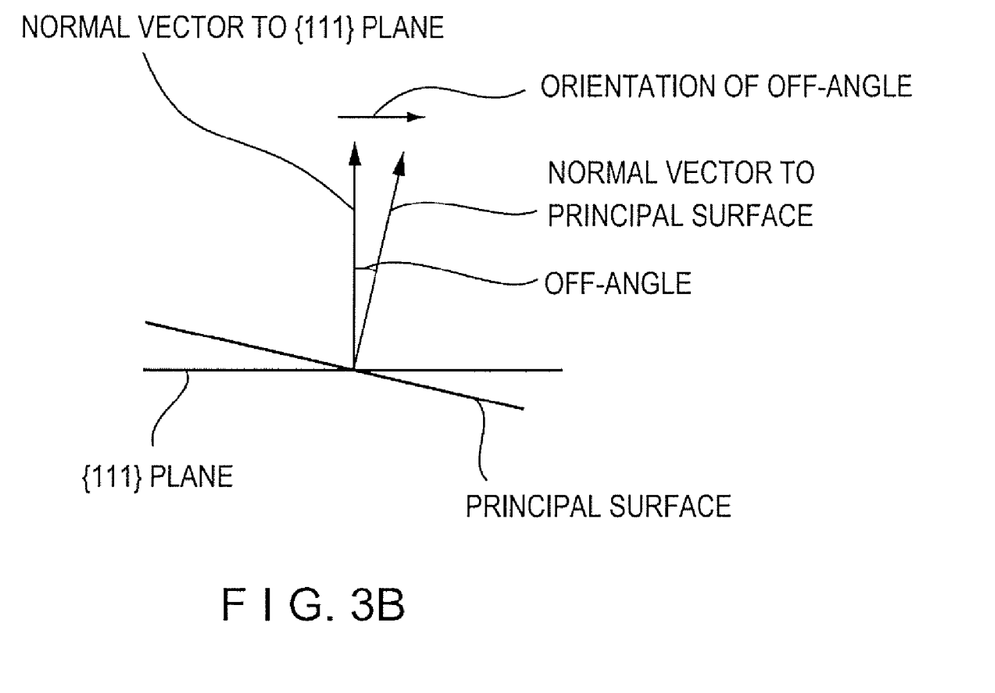
FIG. 3B is a diagram showing the off-angle and the off-angle orientation with respect to the normal vector to the {111} plane.

As shown in FIG. 3A, considering symmetry, the orientation of the off-angle of the principal surface of the diamond {111} monocrystal substrate is indicated by the X° orientation ($0 \leq X \leq 45$) from the [110] direction, or the Y° orientation ($0 \leq Y \leq 45$) from the [211] direction within the {111} plane. The off-angle in the present invention is the angle formed by the normal vector to the {111} plane and the normal vector to the principal surface of the diamond monocrystal substrate, as shown in FIG. 3B. The orientation of the off-angle in the present invention is the orientation towards which the normal vector to the principal surface of the diamond monocrystal substrate is tilted. The off-angle and the orientation of the off-angle can be measured by X-ray diffraction.

As a result of concentrated investigation, the inventors discovered that fluctuation of the off-angle orientation in the diamond {111} monocrystal substrate 10 contributes in no small degree to fluctuation of the specific resistance. The inventors also discovered that when a thin film is synthesized under the aforementioned synthesis conditions on a substrate in which the principal surface 11 has an off-angle of 0.50° or greater, a low-resistance phosphorus-doped diamond epitaxial thin film 21 having a specific resistance of 100 Ωcm or lower at 300 K can be vapor-phase grown when the normal vector to the principal surface 11 is tilted to an orientation ($0 \leq X \leq 40$) that is within 40° from the [110] direction with respect to the normal vector to the {111} plane. The inventors also discovered in the same manner that a low-resistance phosphorus-doped diamond epitaxial thin film 21 having a specific resistance of 100 Ωcm or lower at 300 K can be vapor-phase grown even when the normal vector to the principal surface is tilted to an orientation ($0 \leq Y \leq 40$) within 40° from the [211] direction. The inventors learned that the specific resistance at 300 K exceeds 100 Ωcm when the orientation is other than described above ($40 \leq X \leq 45$, $40 < Y \leq 45$).

Specifically, the inventors discovered that a thin film 21 having even less fluctuation and a specific resistance of 100 Ωcm or lower is obtained by synthesizing a phosphorus-doped diamond epitaxial thin film using a phosphorus atom/carbon atom ratio of 3% or higher in the vapor phase, and using a diamond {111} monocrystal substrate 10 in which the off-angle of the principal surface 11 is 0.56 or greater, and the normal vector to the principal surface 11 is tilted to an orientation within 40° from the [211] direction or the [110] direction with respect to the normal vector to the {111} plane. The inventors also learned that the off-angle of this thin film 21 is 0.56 or greater, and the normal vector is tilted to an orientation within 40° from the [110] direction or the [211] direction.

Furthermore, a thin film 21 having a surface roughness of less than 10 nm and lower resistance is obtained when the surface roughness of a principal surface 11 having an off-angle tilt orientation within the aforementioned range is selected from a range of 10 nm or higher. It was furthermore discovered that when the tilt orientation from the [110] direction and the tilt orientation from the [211] direction are the same angle (X=Y), even when the synthesis conditions, the off-angle of the principal surface, and the surface roughness are all the same, the thin film having a specific resistance of 100 Ωcm or lower has a higher density of steps or kinks, and therefore has lower resistance. The temperature dependency of the specific resistance is even smaller in such a thin film in which the specific resistance is 100 Ωcm or lower, and the thin film is therefore even more suitable for use as a material for devices that are operated at high temperatures.

When a thin film is synthesized under the aforementioned conditions, a high-concentration doped thin film 21 is obtained in which the phosphorus concentration in the thin film is $8.6 \times 10^{19}$ cm$^{-3}$ or higher by selecting a diamond {111} monocrystal substrate 10 in which the off-angle of the principal surface 11 is 0.5° or greater, and the normal vector to the principal surface 11 is tilted to an orientation within 40° from the [110] direction or the [211] direction with respect to the normal vector to the {111} plane. Furthermore, by selecting the surface roughness of the principal surface 11 from values of 10 nm or higher, a thin film 21 can be obtained that has a surface roughness of 10 nm or higher and is doped to a higher concentration. A diamond monocrystal 20 provided with a low-resistance phosphorus-doped diamond epitaxial thin film 21 having a specific resistance of 100 Ωcm or less by high-concentration doping at a phosphorus concentration of $8.6 \times 10^{19}$ cm$^{-3}$ or higher can be obtained without fluctuation only when the off-angle condition and the normal vector tilt orientation condition are coordinated in addition to the aforementioned synthesis conditions.

Through the use of the method for manufacturing a thin-filmed diamond monocrystal, and the thin-filmed diamond monocrystal according to the present invention as described above, a method for manufacturing a diamond monocrystal having a low-resistance phosphorus-doped diamond epitaxial thin film, and a diamond monocrystal having a low-resistance phosphorus-doped diamond epitaxial thin film can be endowed with minimal fluctuation in specific resistance by using a {111} monocrystal substrate having a prescribed off-angle, a prescribed tilt orientation of the normal vector, and a prescribed surface roughness, and by applying a prescribed range of vapor-phase synthesis conditions. The diamond monocrystal having a low-resistance phosphorus-doped diamond epitaxial thin film has low resistance and minimal fluctuation of specific resistance, and can therefore be applied as a material used in environment-resistant devices that operate in high-temperature environments or space environments, power devices capable of high-frequency and high-output operation, luminescent devices capable of emitting ultraviolet light, electron emission devices capable of low-voltage operation, or other semiconductor devices/electronic devices.

Examples will be used to more specifically describe the method for manufacturing a thin-filmed diamond monocrystal, and the thin-filmed diamond monocrystal according to the present invention.

Example 1

A plurality of IIa-type diamond {111} monocrystal substrates 10 such as the one shown in FIG. 1 synthesized at high temperature and high pressure was prepared, and each had a surface roughness of 10 nm, a size of 2.0 mm×2.0 mm×0.3 mm thick, an off-angle of the principal surface 11 controlled to 0.49° to 3.29°, and a tilt orientation of the normal vector to the principal surface 11 controlled to 40° with respect to the [110] direction. Phosphorus-doped diamond epitaxial thin films were synthesized on the principal surfaces 11 by a microwave plasma CVD device. Hydrogen, methane, and phosphine were used as source gases, and the synthesis conditions were a methane gas flow rate/hydrogen gas flow rate ratio of 0.05%, a phosphine gas flow rate/methane gas flow rate ratio ($PH_3/CH_4$, vapor-phase phosphorus atom [P]/carbon atom [C] ratio) of 3 to 20%, a gas-mixture pressure of $1.3 \times 10^4$ Pa, a substrate temperature of 870° C., and a synthesis time of 5 hours.

The synthesized thin films were subjected to acid treatment to completely remove hydrogen termination of the thin-film surfaces, and the specific resistance was measured by the van der Pauw method at 300 K. After the off-angles of the thin films were measured by X-ray diffraction, the phosphorus concentration in the thin films and the thicknesses of the thin films were measured by secondary ion mass spectrometry (SIMS). The synthesis conditions and the evaluation results are shown in Table 1.

TABLE 1

| Sample No. | P/C (%) | Principal Surface Off-angle (°) | Thin-film Off-angle (°) | Specific Resistance (Ωcm) | Phosphorus Concentration (cm$^{-3}$) |
|---|---|---|---|---|---|
| 1 | 3 | 0.53 | 0.53 | 298 | $5.01 \times 10^{19}$ |
| 2 | 3 | 1.21 | 1.21 | 248 | $5.48 \times 10^{19}$ |
| 3 | 3 | 1.94 | 1.94 | 211 | $5.93 \times 10^{19}$ |
| 4 | 3 | 2.57 | 2.57 | 187 | $6.30 \times 10^{19}$ |
| 5 | 3 | 3.24 | 3.24 | 163 | $6.74 \times 10^{19}$ |
| 6 | 7 | 0.51 | 0.51 | 297 | $5.02 \times 10^{19}$ |
| 7 | 7 | 1.23 | 1.23 | 239 | $5.58 \times 10^{19}$ |
| 8 | 7 | 1.99 | 1.99 | 203 | $6.05 \times 10^{19}$ |
| 9 | 7 | 2.55 | 2.55 | 178 | $6.45 \times 10^{19}$ |
| 10 | 7 | 3.26 | 3.26 | 151 | $7.00 \times 10^{19}$ |
| 11 | 10 | 0.54 | 0.54 | 295 | $5.03 \times 10^{19}$ |
| 12 | 10 | 1.26 | 1.26 | 232 | $5.66 \times 10^{19}$ |
| 13 | 10 | 2.03 | 2.03 | 196 | $6.15 \times 10^{19}$ |
| 14 | 10 | 2.53 | 2.53 | 171 | $6.58 \times 10^{19}$ |
| 15 | 10 | 3.22 | 3.22 | 146 | $7.11 \times 10^{19}$ |
| 16 | 20 | 0.52 | 0.52 | 293 | $5.05 \times 10^{19}$ |
| 17 | 20 | 1.26 | 1.26 | 218 | $5.84 \times 10^{19}$ |
| 18 | 20 | 1.97 | 1.97 | 177 | $6.47 \times 10^{19}$ |
| 19 | 20 | 2.54 | 2.54 | 149 | $7.04 \times 10^{19}$ |
| 20 | 20 | 3.29 | 3.29 | 126 | $7.65 \times 10^{19}$ |
| Ref. Example 1 | 2 | 0.52 | 0.52 | 867 | $2.96 \times 10^{19}$ |
| Ref. Example 2 | 3 | 0.49 | 0.49 | 309 | $4.92 \times 10^{19}$ |
| Ref. Example 3 | 7 | 0.49 | 0.49 | 307 | $4.93 \times 10^{19}$ |
| Ref. Example 4 | 10 | 0.49 | 0.49 | 305 | $4.95 \times 10^{19}$ |
| Ref. Example 5 | 20 | 0.49 | 0.49 | 301 | $4.98 \times 10^{19}$ |

The thicknesses of the synthesized thin films were 2.0 μm. When the off-angle of the principal surface 11 was in the range of 0.51° to 3.29°, under synthesis conditions of a vapor-phase phosphorus atom [P]/carbon atom [C] ratio of 3% or higher, diamond monocrystals provided with a low-resistance phosphorus-doped diamond epitaxial thin film were fabricated in which the off-angle of the thin film did not vary from the off-angle of the principal surface, phosphorus was mixed into the thin film at a concentration of $5.0 \times 10^{19}$ cm$^{-3}$ or higher, and the specific resistance was 300 Ωcm or lower. When the off-angle was less than 0.5°, or the vapor-phase phosphorus atom [P]/carbon atom [C] ratio was less than 3%, the phosphorus concentration in the thin films was less than $5 \times 10^{19}$ cm$^{-3}$, and the specific resistance was higher than 300 Ωcm.

Example 2

A plurality of IIa-type diamond {111} monocrystal substrates 10 such as the one shown in FIG. 1 synthesized at high temperature and high pressure was prepared, and each had a surface roughness of 10 nm, a size of 2.0 mm×2.0 mm×0.3 mm thick, an off-angle of the principal surface 11 controlled to 0.51° to 3.16°, and a tilt orientation of the normal vector to the principal surface 11 controlled to 1.7° to 43.3° with respect to the [110] direction. Phosphorus-doped diamond epitaxial thin films were synthesized on the principal surfaces 11 by a microwave plasma CVD device. Hydrogen, methane, and phosphine were used as source gases, and the synthesis conditions were a methane gas flow rate/hydrogen gas flow rate ratio of 0.05%, a phosphine gas flow rate/methane gas flow rate ratio (PH$_3$/CH$_4$, vapor-phase phosphorus atom [P]/carbon atom [C] ratio) of 3 and 10%, a gas-mixture pressure of $1.3 \times 10^4$ Pa, a substrate temperature of 870° C., and a synthesis time of 5 hours. Evaluation of the synthesized thin films included measurement of the tilt of the normal vector to the thin films by X-ray diffraction, in addition to the same evaluations performed in Example 1. The synthesis conditions and evaluation results are shown in Table 2. In Table 2, the normal vectors are indicated as the tilt with respect to the [110] direction.

TABLE 2

| Sample No. | P/C (%) | Principal Surface Off-angle (°) | Principal Surface Normal Vector (°) From [110] Direction | Thin-film Off-angle (°) | Thin Film Normal Vector (°) From [110] Direction | Specific Resistance (Ωcm) | Phosphorus Concentration (cm$^{-3}$) |
|---|---|---|---|---|---|---|---|
| 21 | 3 | 0.51 | 39.8 | 0.51 | 39.8 | 98.5 | $8.63 \times 10^{19}$ |
| 22 | 3 | 0.51 | 33.2 | 0.51 | 33.2 | 92.3 | $8.91 \times 10^{19}$ |
| 23 | 3 | 0.51 | 24.1 | 0.51 | 24.1 | 86.1 | $9.22 \times 10^{19}$ |
| 24 | 3 | 0.51 | 11.3 | 0.51 | 11.3 | 80.5 | $9.53 \times 10^{19}$ |
| 25 | 3 | 0.51 | 2.6 | 0.51 | 2.6 | 75.6 | $9.83 \times 10^{19}$ |
| 26 | 3 | 1.91 | 39.5 | 1.91 | 39.5 | 65.4 | $1.06 \times 10^{20}$ |
| 27 | 3 | 1.91 | 31.8 | 1.91 | 31.8 | 62.3 | $1.08 \times 10^{20}$ |
| 28 | 3 | 1.91 | 22.9 | 1.91 | 22.9 | 59.1 | $1.11 \times 10^{20}$ |
| 29 | 3 | 1.91 | 15.4 | 1.91 | 15.4 | 56.5 | $1.13 \times 10^{20}$ |
| 30 | 3 | 1.91 | 4.1 | 1.91 | 4.1 | 53.2 | $1.17 \times 10^{20}$ |
| 31 | 10 | 0.77 | 39.7 | 0.77 | 39.7 | 90.2 | $9.01 \times 10^{19}$ |
| 32 | 10 | 0.77 | 32.5 | 0.77 | 32.5 | 84.7 | $9.30 \times 10^{19}$ |
| 33 | 10 | 0.77 | 24.6 | 0.77 | 24.6 | 78.7 | $9.64 \times 10^{19}$ |
| 34 | 10 | 0.77 | 12.8 | 0.77 | 12.8 | 72.6 | $1.00 \times 10^{20}$ |
| 35 | 10 | 0.77 | 1.7 | 0.77 | 1.7 | 67.1 | $1.04 \times 10^{20}$ |
| 36 | 10 | 3.16 | 39.3 | 3.16 | 39.3 | 50.3 | $1.20 \times 10^{20}$ |
| 37 | 10 | 3.16 | 31.9 | 3.16 | 31.9 | 47.2 | $1.24 \times 10^{20}$ |
| 38 | 10 | 3.16 | 21.8 | 3.16 | 21.8 | 42.9 | $1.30 \times 10^{20}$ |
| 39 | 10 | 3.16 | 14.3 | 3.16 | 14.3 | 41.1 | $1.33 \times 10^{20}$ |
| 40 | 10 | 3.16 | 2.8 | 3.16 | 2.8 | 38.9 | $1.36 \times 10^{20}$ |
| Ref. Example 6 | 2 | 0.51 | 39.8 | 0.51 | 39.8 | 314 | $4.88 \times 10^{19}$ |
| Ref. Example 7 | 3 | 0.51 | 40.9 | 0.51 | 40.9 | 131 | $7.50 \times 10^{19}$ |
| Ref. Example 8 | 3 | 0.51 | 42.5 | 0.51 | 42.5 | 208 | $5.98 \times 10^{19}$ |
| Ref. Example 9 | 3 | 1.91 | 40.6 | 1.91 | 40.6 | 103 | $8.44 \times 10^{19}$ |
| Ref. Example 10 | 3 | 1.91 | 42.8 | 1.91 | 42.8 | 164 | $6.72 \times 10^{19}$ |
| Ref. Example 11 | 10 | 0.77 | 40.3 | 0.77 | 40.3 | 106 | $8.33 \times 10^{19}$ |
| Ref. Example 12 | 10 | 0.77 | 43.3 | 0.77 | 43.3 | 199 | $6.11 \times 10^{19}$ |
| Ref. Example 13 | 10 | 3.16 | 40.8 | 3.16 | 40.8 | 101 | $8.53 \times 10^{19}$ |
| Ref. Example 14 | 10 | 3.16 | 43.2 | 3.16 | 43.2 | 126 | $7.65 \times 10^{19}$ |

The thicknesses of the synthesized thin films were 2.0 μm. When the tilt orientation of the normal vector to the principal surface 11 was in the range of 1.7° to 39.8° with respect to the [110] direction, under synthesis conditions of a vapor-phase phosphorus atom [P]/carbon atom [C] ratio of 3% or higher, diamond monocrystals provided with a low-resistance phosphorus-doped diamond epitaxial thin film were fabricated in which the tilt orientation of the normal vector to the thin film did not vary from the tilt orientation of the normal vector to the principal surface, phosphorus was mixed into the thin film at a concentration of $8.6 \times 10^{19}$ cm$^{-3}$ or higher, and the specific resistance was 100 Ωcm or lower. When the tilt orientation of the normal vector was greater than 40° with respect to the [110] direction, or the vapor-phase phosphorus atom [P]/carbon atom [C] ratio was less than 3%, the phosphorus concentration in the thin films was less than $8.6 \times 10^{19}$ cm$^{-3}$, and the specific resistance was higher than 100 Ωcm.

Example 3

A plurality of IIa-type diamond {111} monocrystal substrates 10 such as the one shown in FIG. 1 synthesized at high temperature and high pressure was prepared, and each had a surface roughness of 10 nm, a size of 2.0 mm×2.0 mm×0.3 mm thick, an off-angle of the principal surface 11 controlled to 0.51° to 3.16°, and a tilt orientation of the normal vector to the principal surface 11 controlled to 1.7° to 43.3° with respect to the [211] direction. Phosphorus-doped diamond epitaxial thin films were synthesized on the principal surfaces 11 by a microwave plasma CVD device. Hydrogen, methane, and phosphine were used as source gases, and the synthesis conditions were a methane gas flow rate/hydrogen gas flow rate ratio of 0.05%, a phosphine gas flow rate/methane gas flow rate ratio ($PH_3/CH_4$, vapor-phase phosphorus atom [P]/carbon atom [C] ratio) of 3 and 10%, a gas-mixture pressure of $1.3 \times 10^4$ Pa, a substrate temperature of 870° C., and a synthesis time of 5 hours. The synthesized thin films were evaluated in the same manner as in Example 2. The synthesis conditions and evaluation results are shown in Table 3. In Table 3, the normal vectors are indicated as the tilt with respect to the [211] direction.

TABLE 3

| Sample No. | P/C (%) | Principal Surface Off-angle (°) | Principal Surface Normal Vector (°) From [211] Direction | Thin-film Off-angle (°) | Thin Film Normal Vector (°) From [211] Direction | Specific Resistance (Ωcm) | Phosphorus Concentration (cm$^{-3}$) |
|---|---|---|---|---|---|---|---|
| 41 | 3 | 0.51 | 39.8 | 0.51 | 39.8 | 97.4 | $8.68 \times 10^{19}$ |
| 42 | 3 | 0.51 | 33.2 | 0.51 | 33.2 | 91.5 | $8.95 \times 10^{19}$ |
| 43 | 3 | 0.51 | 24.1 | 0.51 | 24.1 | 85.2 | $9.27 \times 10^{19}$ |
| 44 | 3 | 0.51 | 11.3 | 0.51 | 11.3 | 79.8 | $9.57 \times 10^{19}$ |
| 45 | 3 | 0.51 | 2.6 | 0.51 | 2.6 | 74.2 | $9.92 \times 10^{19}$ |
| 46 | 3 | 1.91 | 39.5 | 1.91 | 39.5 | 64.1 | $1.07 \times 10^{20}$ |
| 47 | 3 | 1.91 | 31.8 | 1.91 | 31.8 | 61.4 | $1.09 \times 10^{20}$ |
| 48 | 3 | 1.91 | 22.9 | 1.91 | 22.9 | 57.9 | $1.12 \times 10^{20}$ |
| 49 | 3 | 1.91 | 15.4 | 1.91 | 15.4 | 55.3 | $1.15 \times 10^{20}$ |
| 50 | 3 | 1.91 | 4.1 | 1.91 | 4.1 | 52.1 | $1.18 \times 10^{20}$ |
| 51 | 10 | 0.77 | 39.7 | 0.77 | 39.7 | 89.3 | $9.06 \times 10^{19}$ |
| 52 | 10 | 0.77 | 32.5 | 0.77 | 32.5 | 83.6 | $9.36 \times 10^{19}$ |
| 53 | 10 | 0.77 | 24.6 | 0.77 | 24.6 | 77.5 | $9.71 \times 10^{19}$ |
| 54 | 10 | 0.77 | 12.8 | 0.77 | 12.8 | 71.4 | $1.01 \times 10^{20}$ |
| 55 | 10 | 0.77 | 1.7 | 0.77 | 1.7 | 65.9 | $1.05 \times 10^{20}$ |
| 56 | 10 | 3.16 | 39.3 | 3.16 | 39.3 | 49.4 | $1.21 \times 10^{20}$ |
| 57 | 10 | 3.16 | 31.9 | 3.16 | 31.9 | 46.1 | $1.25 \times 10^{20}$ |
| 58 | 10 | 3.16 | 21.8 | 3.16 | 21.8 | 41.7 | $1.32 \times 10^{20}$ |
| 59 | 10 | 3.16 | 14.3 | 3.16 | 14.3 | 39.9 | $1.35 \times 10^{20}$ |
| 60 | 10 | 3.16 | 2.8 | 3.16 | 2.8 | 37.5 | $1.39 \times 10^{20}$ |
| Ref. Example 15 | 2 | 0.51 | 39.8 | 0.51 | 39.8 | 313 | $4.89 \times 10^{19}$ |
| Ref. Example 16 | 3 | 0.51 | 40.9 | 0.51 | 40.9 | 129 | $7.56 \times 10^{19}$ |
| Ref. Example 17 | 3 | 0.51 | 42.5 | 0.51 | 42.5 | 207 | $5.99 \times 10^{19}$ |
| Ref. Example 18 | 3 | 1.91 | 40.6 | 1.91 | 40.6 | 102 | $8.48 \times 10^{19}$ |
| Ref. Example 19 | 3 | 1.91 | 42.8 | 1.91 | 42.8 | 163 | $6.74 \times 10^{19}$ |
| Ref. Example 20 | 10 | 0.77 | 40.3 | 0.77 | 40.3 | 105 | $8.36 \times 10^{19}$ |
| Ref. Example 21 | 10 | 0.77 | 43.3 | 0.77 | 43.3 | 197 | $6.14 \times 10^{19}$ |
| Ref. Example 22 | 10 | 3.16 | 40.8 | 3.16 | 40.8 | 101 | $8.53 \times 10^{19}$ |
| Ref. Example 23 | 10 | 3.16 | 43.2 | 3.16 | 43.2 | 124 | $7.71 \times 10^{19}$ |

The thicknesses of the synthesized thin films were 2.0 μm. When the tilt orientation of the normal vector to the principal surface 11 was in the range of 1.7° to 39.8° with respect to the [211] direction, under synthesis conditions of a vapor-phase phosphorus atom [P]/carbon atom [C] ratio of 3% or higher, diamond monocrystals provided with a low-resistance phosphorus-doped diamond epitaxial thin film were fabricated in which the tilt orientation of the normal vector to the thin film did not vary from the tilt orientation of the normal vector to the principal surface, phosphorus was mixed into the thin film at a concentration of $8.6 \times 10^{19}$ cm$^{-3}$ or higher, and the specific resistance was 100 Ωcm or lower. When the tilt orientation of the normal vector was greater than 40° with respect to the [211] direction, or the vapor-phase phosphorus atom [P]/carbon atom [C] ratio was less than 3%, the phosphorus concentration in the thin films was less than $8.6 \times 10^{19}$ cm$^{-3}$, and the specific resistance was higher than 100 Ωcm. Phosphorus was also doped to a higher concentration than in Example 2, and the specific resistance was lower.

Example 4

A plurality of IIa-type diamond {111} monocrystal substrates 10 such as the one shown in FIG. 1 synthesized at high temperature and high pressure was prepared, and each had a surface roughness of 1 nm to 45 nm, a size of 2.0 mm×2.0 mm×0.3 mm thick, an off-angle of the principal surface 11 controlled to 0.51° to 3.41°, and a tilt orientation of the normal vector to the principal surface 11 controlled to 40° with respect to the [110] direction. Phosphorus-doped diamond epitaxial thin films were synthesized on the principal surfaces 11 by a microwave plasma CVD device. Hydrogen, methane, and phosphine were used as source gases, and the synthesis conditions were a methane gas flow rate/hydrogen gas flow rate ratio of 0.05%, a phosphine gas flow rate/methane gas flow rate ratio (PH$_3$/CH$_4$, vapor-phase phosphorus atom [P]/carbon atom [C] ratio) of 3 to 20%, a gas-mixture pressure of $1.3 \times 10^4$ Pa, a substrate temperature of 870° C., and a synthesis time of 5 hours. Evaluation of the synthesized thin films included measurement of the surface roughness of the thin film and the principal surface of the substrate by AFM or a pin-type surface roughness meter, in addition to the same evaluations performed in Example 1. The synthesis conditions and evaluation results are shown in Table 4.

diamond monocrystals provided with a low-resistance phosphorus-doped diamond epitaxial thin film were fabricated in which the off-angle and surface roughness of the thin film did not vary from the off-angle and surface roughness of the principal surface, phosphorus was mixed into the thin film at a concentration of $5.0 \times 10^{19}$ cm$^{-3}$ or higher, and the specific resistance was 300 Ωcm or lower. Phosphorus was doped to a higher concentration, and the resistance was lower than in samples in which the surface roughness of the principal surface 11 (and the thin film) was less than 10 nm.

Example 5

A plurality of IIa-type diamond {111} monocrystal substrates 10 such as the one shown in FIG. 1 synthesized at high temperature and high pressure was prepared, and each had a surface roughness of 1 nm to 43 nm, a size of 2.0 mm×2.0 mm×0.3 mm thick, an off-angle of the principal surface 11 controlled to 0.50° to 3.14°, and a tilt orientation of the normal vector to the principal surface 11 controlled to 26.3° to 39.9° with respect to the [110] direction. Phosphorus-doped diamond epitaxial thin films were synthesized on the principal surfaces 11 by a microwave plasma CVD device. Hydrogen, methane, and phosphine were used as source gases, and the synthesis conditions were a methane gas flow rate/hydrogen gas flow rate ratio of 0.05%, a phosphine gas flow rate/methane gas flow rate ratio (PH$_3$/CH$_4$, vapor-phase phosphorus atom [P]/carbon atom [C] ratio) of 3 and 10%, a gas-mixture pressure of $1.3 \times 10^4$ Pa, a substrate temperature of 870° C., and a synthesis time of 5 hours. Evaluation of the synthesized thin films included measurement of the surface roughness of the thin film and the principal surface of the

TABLE 4

| Sample No. | P/C (%) | Principal Surface Off-angle (°) | Surface Roughness of Principal Surface (nm) | Thin-film Off-angle (°) | Surface Roughness of Thin Film (nm) | Specific Resistance (Ωcm) | Phosphorus Concentration (cm$^{-3}$) |
|---|---|---|---|---|---|---|---|
| 61 | 3 | 0.52 | 10 | 0.52 | 10 | 299 | $5.01 \times 10^{19}$ |
| 62 | 3 | 0.52 | 21 | 0.52 | 21 | 296 | $5.03 \times 10^{19}$ |
| 63 | 3 | 0.52 | 43 | 0.52 | 43 | 291 | $5.07 \times 10^{19}$ |
| 64 | 3 | 2.56 | 11 | 2.56 | 11 | 186 | $6.31 \times 10^{19}$ |
| 65 | 3 | 2.56 | 22 | 2.56 | 22 | 182 | $6.38 \times 10^{19}$ |
| 66 | 3 | 2.56 | 41 | 2.56 | 41 | 176 | $6.49 \times 10^{19}$ |
| 67 | 10 | 0.51 | 10 | 0.51 | 10 | 298 | $5.01 \times 10^{19}$ |
| 68 | 10 | 0.51 | 19 | 0.51 | 19 | 293 | $5.05 \times 10^{19}$ |
| 69 | 10 | 0.51 | 38 | 0.51 | 38 | 288 | $5.09 \times 10^{19}$ |
| 70 | 10 | 2.58 | 10 | 2.58 | 10 | 168 | $6.64 \times 10^{19}$ |
| 71 | 10 | 2.58 | 21 | 2.58 | 21 | 163 | $6.74 \times 10^{19}$ |
| 72 | 10 | 2.58 | 45 | 2.58 | 45 | 158 | $6.84 \times 10^{19}$ |
| 73 | 20 | 0.53 | 11 | 0.53 | 11 | 291 | $5.07 \times 10^{19}$ |
| 74 | 20 | 0.53 | 20 | 0.53 | 20 | 285 | $5.12 \times 10^{19}$ |
| 75 | 20 | 0.53 | 40 | 0.53 | 40 | 279 | $5.17 \times 10^{19}$ |
| 76 | 20 | 3.41 | 10 | 3.41 | 10 | 120 | $7.83 \times 10^{19}$ |
| 77 | 20 | 3.41 | 21 | 3.41 | 21 | 114 | $8.03 \times 10^{19}$ |
| 78 | 20 | 3.41 | 43 | 3.41 | 43 | 108 | $8.25 \times 10^{19}$ |
| Ref. Example 24 | 3 | 0.52 | 9 | 0.52 | 9 | 300 | $5.00 \times 10^{19}$ |
| Ref. Example 25 | 3 | 0.52 | 5 | 0.52 | 5 | 300 | $5.00 \times 10^{19}$ |
| Ref. Example 26 | 3 | 0.52 | 1 | 0.52 | 1 | 300 | $5.00 \times 10^{19}$ |

The thicknesses of the synthesized thin films were 2.0 μm. When the surface roughness of the principal surface 11 was 10 nm or higher, under synthesis conditions of an off-angle of the principal surface 11 of 0.50° or greater and a vapor-phase phosphorus atom [P]/carbon atom [C] ratio of 3% or higher, substrate by AFM or a pin-type surface roughness meter, in addition to the same evaluations performed in Example 3. The synthesis conditions and evaluation results are shown in Table 5. In Table 5, the normal vectors are indicated as the tilt with respect to the [110] direction.

TABLE 5

| Sample No. | P/C (%) | Principal Surface Off-angle (°) | Principal Surface Normal Vector (°) From [110] Direction | Surface Roughness of Principal Surface (nm) | Thin-film Off-angle (°) | Thin-film Normal Vector (°) From [110] Direction | Surface Roughness of Thin Film (nm) | Specific Resistance ($\Omega$cm) | Phosphorus Concentration ($cm^{-3}$) |
|---|---|---|---|---|---|---|---|---|---|
| 79 | 3 | 0.50 | 39.9 | 10 | 0.50 | 39.9 | 10 | 99.2 | $8.60 \times 10^{19}$ |
| 80 | 3 | 0.50 | 39.9 | 21 | 0.50 | 39.9 | 21 | 96.2 | $8.73 \times 10^{19}$ |
| 81 | 3 | 0.50 | 39.9 | 43 | 0.50 | 39.9 | 43 | 92.1 | $8.92 \times 10^{19}$ |
| 82 | 3 | 0.50 | 27.1 | 11 | 0.50 | 27.1 | 11 | 87.2 | $9.17 \times 10^{19}$ |
| 83 | 3 | 0.50 | 27.1 | 22 | 0.50 | 27.1 | 22 | 84.1 | $9.33 \times 10^{19}$ |
| 84 | 3 | 0.50 | 27.1 | 42 | 0.50 | 27.1 | 42 | 79.9 | $9.57 \times 10^{19}$ |
| 85 | 3 | 1.89 | 40.0 | 11 | 1.89 | 40.0 | 11 | 65.3 | $1.06 \times 10^{20}$ |
| 86 | 3 | 1.89 | 40.0 | 21 | 1.89 | 40.0 | 21 | 62.1 | $1.08 \times 10^{20}$ |
| 87 | 3 | 1.89 | 40.0 | 43 | 1.89 | 40.0 | 43 | 58.5 | $1.12 \times 10^{20}$ |
| 88 | 3 | 1.89 | 26.3 | 10 | 1.89 | 26.3 | 10 | 61.4 | $1.09 \times 10^{20}$ |
| 89 | 3 | 1.89 | 26.3 | 22 | 1.89 | 26.3 | 22 | 58.1 | $1.12 \times 10^{20}$ |
| 90 | 3 | 1.89 | 26.3 | 40 | 1.89 | 26.3 | 40 | 54.3 | $1.16 \times 10^{20}$ |
| 91 | 10 | 0.75 | 39.8 | 10 | 0.75 | 39.8 | 10 | 90.5 | $9.00 \times 10^{19}$ |
| 92 | 10 | 0.75 | 39.8 | 21 | 0.75 | 39.8 | 21 | 87.1 | $9.17 \times 10^{19}$ |
| 93 | 10 | 0.75 | 39.8 | 42 | 0.75 | 39.8 | 42 | 82.4 | $9.42 \times 10^{19}$ |
| 94 | 10 | 0.75 | 28.3 | 11 | 0.75 | 28.3 | 11 | 78.9 | $9.63 \times 10^{19}$ |
| 95 | 10 | 0.75 | 28.3 | 20 | 0.75 | 28.3 | 20 | 75.3 | $9.85 \times 10^{19}$ |
| 96 | 10 | 0.75 | 28.3 | 41 | 0.75 | 28.3 | 41 | 71.4 | $1.01 \times 10^{20}$ |
| 97 | 10 | 3.14 | 39.6 | 11 | 3.14 | 39.6 | 11 | 51.7 | $1.19 \times 10^{20}$ |
| 98 | 10 | 3.14 | 39.6 | 21 | 3.14 | 39.6 | 21 | 47.9 | $1.23 \times 10^{20}$ |
| 99 | 10 | 3.14 | 39.6 | 43 | 3.14 | 39.6 | 43 | 43.1 | $1.30 \times 10^{20}$ |
| 100 | 10 | 3.14 | 27.9 | 10 | 3.14 | 27.9 | 10 | 43.4 | $1.29 \times 10^{20}$ |
| 101 | 10 | 3.14 | 27.9 | 22 | 3.14 | 27.9 | 22 | 39.8 | $1.35 \times 10^{20}$ |
| 102 | 10 | 3.14 | 27.9 | 41 | 3.14 | 27.9 | 41 | 35.3 | $1.43 \times 10^{20}$ |
| Ref. Example 27 | 3 | 0.50 | 39.9 | 9 | 0.50 | 39.9 | 9 | 100 | $8.60 \times 10^{19}$ |
| Ref. Example 28 | 3 | 0.50 | 39.9 | 5 | 0.50 | 39.9 | 5 | 100 | $8.60 \times 10^{19}$ |
| Ref. Example 29 | 3 | 0.50 | 39.9 | 1 | 0.50 | 39.9 | 1 | 100 | $8.60 \times 10^{19}$ |

The thicknesses of the synthesized thin films were 2.0 μm. When the surface roughness of the principal surface 11 was 10 nm or higher, under synthesis conditions of an off-angle of the principal surface 11 of 0.50° or greater and a vapor-phase phosphorus atom [P]/carbon atom [C] ratio of 3% or higher, diamond monocrystals provided with a low-resistance phosphorus-doped diamond epitaxial thin film were fabricated in which the off-angle and surface roughness of the thin film did not vary from the off-angle and surface roughness of the principal surface, phosphorus was mixed into the thin film at a concentration of $8.6 \times 10^{19}$ $cm^{-3}$ or higher, and the specific resistance was 100 Ωcm or lower. Phosphorus was doped to a higher concentration, and the resistance was lower than in samples in which the surface roughness of the principal surface 11 (and the thin film) was less than 10 nm.

Example 6

A plurality of IIa-type diamond {111} monocrystal substrates 10 such as the one shown in FIG. 1 synthesized at high temperature and high pressure was prepared, and each had a surface roughness of 1 nm to 43 nm, a size of 2.0 mm×2.0 mm×0.3 mm thick, an off-angle of the principal surface 11 controlled to 0.50° to 3.14°, and a tilt orientation of the normal vector to the principal surface 11 controlled to 26.3° to 39.9° with respect to the [211] direction. Phosphorus-doped diamond epitaxial thin films were synthesized on the principal surfaces 11 by a microwave plasma CVD device. Hydrogen, methane, and phosphine were used as source gases, and the synthesis conditions were a methane gas flow rate/hydrogen gas flow rate ratio of 0.05%, a phosphine gas flow rate/methane gas flow rate ratio ($PH_3/CH_4$, vapor-phase phosphorus atom [P]/carbon atom [C] ratio) of 3 and 10%, a gas-mixture pressure of $1.3 \times 10^4$ Pa, a substrate temperature of 870° C., and a synthesis time of 5 hours. Evaluation of the synthesized thin films was performed in the same manner as in Example 5. The synthesis conditions and evaluation results are shown in Table 6. In Table 6, the normal vectors are indicated as the tilt with respect to the [211] direction.

TABLE 6

| Sample No. | P/C (%) | Principal Surface Off-angle (°) | Principal Surface Normal Vector (°) From [211] Direction | Surface Roughness of Principal Surface (nm) | Thin-film Off-angle (°) | Thin-film Normal Vector (°) From [211] Direction | Surface Roughness of Thin Film (nm) | Specific Resistance ($\Omega$cm) | Phosphorus Concentration ($cm^{-3}$) |
|---|---|---|---|---|---|---|---|---|---|
| 103 | 3 | 0.50 | 39.9 | 10 | 0.50 | 39.9 | 10 | 98.4 | $8.64 \times 10^{19}$ |
| 104 | 3 | 0.50 | 39.9 | 21 | 0.50 | 39.9 | 21 | 95.1 | $8.78 \times 10^{19}$ |
| 105 | 3 | 0.50 | 39.9 | 43 | 0.50 | 39.9 | 43 | 90.8 | $8.98 \times 10^{19}$ |
| 106 | 3 | 0.50 | 27.1 | 11 | 0.50 | 27.1 | 11 | 85.9 | $9.23 \times 10^{19}$ |
| 107 | 3 | 0.50 | 27.1 | 22 | 0.50 | 27.1 | 22 | 82.8 | $9.40 \times 10^{19}$ |

TABLE 6-continued

| Sample No. | P/C (%) | Principal Surface Off-angle (°) | Principal Surface Normal Vector (°) From [211] Direction | Surface Roughness of Principal Surface (nm) | Thin-film Off-angle (°) | Thin-film Normal Vector (°) From [211] Direction | Surface Roughness of Thin Film (nm) | Specific Resistance (Ωcm) | Phosphorus Concentration (cm$^{-3}$) |
|---|---|---|---|---|---|---|---|---|---|
| 108 | 3 | 0.50 | 27.1 | 42 | 0.50 | 27.1 | 42 | 78.7 | $9.64 \times 10^{19}$ |
| 109 | 3 | 1.89 | 40.0 | 11 | 1.89 | 40.0 | 11 | 64.4 | $1.06 \times 10^{20}$ |
| 110 | 3 | 1.89 | 40.0 | 21 | 1.89 | 40.0 | 21 | 61.5 | $1.09 \times 10^{20}$ |
| 111 | 3 | 1.89 | 40.0 | 43 | 1.89 | 40.0 | 43 | 57.4 | $1.13 \times 10^{20}$ |
| 112 | 3 | 1.89 | 26.3 | 10 | 1.89 | 26.3 | 10 | 60.7 | $1.10 \times 10^{20}$ |
| 113 | 3 | 1.89 | 26.3 | 22 | 1.89 | 26.3 | 22 | 56.9 | $1.13 \times 10^{20}$ |
| 114 | 3 | 1.89 | 26.3 | 40 | 1.89 | 26.3 | 40 | 53.2 | $1.17 \times 10^{20}$ |
| 115 | 10 | 0.75 | 39.8 | 10 | 0.75 | 39.8 | 10 | 89.3 | $9.06 \times 10^{19}$ |
| 116 | 10 | 0.75 | 39.8 | 21 | 0.75 | 39.8 | 21 | 86.1 | $9.22 \times 10^{19}$ |
| 117 | 10 | 0.75 | 39.8 | 42 | 0.75 | 39.8 | 42 | 81.5 | $9.48 \times 10^{19}$ |
| 118 | 10 | 0.75 | 28.3 | 11 | 0.75 | 28.3 | 11 | 77.6 | $9.71 \times 10^{19}$ |
| 119 | 10 | 0.75 | 28.3 | 20 | 0.75 | 28.3 | 20 | 74.2 | $9.92 \times 10^{19}$ |
| 120 | 10 | 0.75 | 28.3 | 41 | 0.75 | 28.3 | 41 | 70.3 | $1.02 \times 10^{20}$ |
| 121 | 10 | 3.14 | 39.6 | 11 | 3.14 | 39.6 | 11 | 50.7 | $1.20 \times 10^{20}$ |
| 122 | 10 | 3.14 | 39.6 | 21 | 3.14 | 39.6 | 21 | 46.6 | $1.25 \times 10^{20}$ |
| 123 | 10 | 3.14 | 39.6 | 43 | 3.14 | 39.6 | 43 | 42.0 | $1.31 \times 10^{20}$ |
| 124 | 10 | 3.14 | 27.9 | 10 | 3.14 | 27.9 | 10 | 42.1 | $1.31 \times 10^{20}$ |
| 125 | 10 | 3.14 | 27.9 | 22 | 3.14 | 27.9 | 22 | 38.7 | $1.37 \times 10^{20}$ |
| 126 | 10 | 3.14 | 27.9 | 41 | 3.14 | 27.9 | 41 | 34.1 | $1.45 \times 10^{20}$ |
| Ref. Example 30 | 3 | 0.50 | 39.9 | 9 | 0.50 | 39.9 | 9 | 99.9 | $8.61 \times 10^{19}$ |
| Ref. Example 31 | 3 | 0.50 | 39.9 | 5 | 0.50 | 39.9 | 5 | 99.9 | $8.61 \times 10^{19}$ |
| Ref. Example 32 | 3 | 0.50 | 39.9 | 1 | 0.50 | 39.9 | 1 | 99.9 | $8.61 \times 10^{19}$ |

The thicknesses of the synthesized thin films were 2.0 μm. When the surface roughness of the principal surface 11 was 10 nm or higher, under synthesis conditions of an off-angle of the principal surface 11 of 0.50° or greater and a vapor-phase phosphorus atom [P]/carbon atom [C] ratio of 3% or higher, diamond monocrystals provided with a low-resistance phosphorus-doped diamond epitaxial thin film were fabricated in which the off-angle and surface roughness of the thin film did not vary from the off-angle and surface roughness of the principal surface, phosphorus was mixed into the thin film at a concentration of $8.6 \times 10^{19}$ cm$^{-3}$ or higher, and the specific resistance was 100 Ωcm or lower. Phosphorus was doped to a higher concentration, and the resistance was lower than in samples in which the surface roughness of the principal surface 11 (and the thin film) was less than 10 nm. Phosphorus was also doped to a higher concentration, and the specific resistance was lower in comparison to Example 5.

INDUSTRIAL APPLICABILITY

Through the use of the method for manufacturing a thin-filmed diamond monocrystal, and the thin-filmed diamond monocrystal according to the present invention as described above, a method for manufacturing a diamond monocrystal having a low-resistance phosphorus-doped diamond epitaxial thin film, and a diamond monocrystal having a low-resistance phosphorus-doped diamond epitaxial thin film can be endowed with minimal fluctuation in specific resistance. The diamond monocrystal having a low-resistance phosphorus-doped diamond epitaxial thin film has low resistance and minimal fluctuation of specific resistance, and can therefore be applied as a material used in environment-resistant devices that operate in high-temperature environments or space environments, power devices capable of high-frequency and high-output operation, luminescent devices capable of emitting ultraviolet light, electron emission devices capable of low-voltage operation, or other semiconductor devices/electronic devices.

The invention claimed is:

1. A method of manufacturing a diamond monocrystal with a low-resistance phosphorus-doped diamond epitaxial thin film comprising:
   providing a diamond monocrystal substrate with a principal surface that has an off-angle of 0.50° or greater with respect to a {111} plane of the diamond monocrystal substrate; and
   growing the thin film on the principal surface of the diamond monocrystal substrate with a vapor-phase growth method such that the thin film is a low-resistance phosphorus-doped epitaxial thin film having a specific resistance of 300 Ωcm or less at 300 K and the content of phosphorus atoms in a source gas of vapor-phase growth is 3% or more of the content of carbon atoms.

2. A method of manufacturing a diamond monocrystal with a low-resistance phosphorus-doped diamond epitaxial thin film comprising:
   providing a diamond monocrystal substrate with a principal surface that has an off-angle of 0.50° or greater with respect to a {111} plane of the diamond monocrystal substrate; and
   growing the thin film on the principal surface of the diamond monocrystal substrate with a vapor-phase growth method such that the thin film is a low-resistance phosphorus-doped epitaxial thin film having a specific resistance of 100 Ωcm or less at 300 K, a normal vector to the principal surface is tilted toward an orientation within 40° from a [110] direction with respect to the normal vector to the {111} plane and the content of phosphorus atoms in a source gas of vapor-phase growth is 3% or more of the content of carbon atoms.

3. A method of manufacturing a diamond monocrystal with a low-resistance phosphorus-doped diamond epitaxial thin film comprising:
   providing a diamond monocrystal substrate with a principal surface that has an off-angle of 0.50° or greater with respect to a {111} plane of the diamond monocrystal substrate; and growing the thin film on the principal surface of the diamond monocrystal substrate with a vapor-phase growth method such that the thin film is a low-resistance phosphorus-doped epitaxial thin film having a specific resistance of 100 Ωcm or less at 300 K, a normal vector to the principal surface is tilted to an orientation within 40° from a [211] direction with respect to the normal vector to the {111} plane and the content of phosphorus atoms in a source gas of vapor-phase growth is 3% or more of the content of carbon atoms.

4. The method for manufacturing a diamond monocrystal having a phosphorus-doped diamond epitaxial thin film according to any of claims 1 through 3, characterized in that
the providing of the diamond monocrystal substrate is such that a surface roughness of the principal surface is 10 nm or higher.

5. A diamond monocrystal comprising:
a diamond monocrystal having a principal surface;
a low-resistance phosphorus-doped diamond epitaxial thin film grown on the principal surface of the diamond monocrystal, the principle surface having an off-plane with respect to a {111} plane;
a surface of the thin-film has an off-angle of 0.50° or greater with respect to the {111} plane; and
a specific resistance of the low-resistance phosphorus-doped diamond epitaxial thin film is 300 Ωcm or less at 300 K.

6. The diamond monocrystal according to claim 5, wherein
a phosphorus concentration of the low-resistance phosphorus-doped diamond epitaxial thin film is $5.0 \times 10^{19}$ cm$^{-3}$ or higher.

7. A diamond monocrystal comprising:
a diamond monocrystal having a principal surface; and
a low-resistance phosphorus-doped diamond epitaxial thin film grown on a principal surface of the diamond monocrystal having an off-plane with respect to a {111} plane, the thin-film surface having an off-angle of 0.50° or greater with respect to the {111} plane, a normal vector to the thin film is tilted to an orientation within 40° from a [110] direction with respect to the normal vector to a {111} plane and a specific resistance of the low-resistance phosphorus-doped diamond epitaxial thin film is 100 Ωcm or less at 300 K.

8. A diamond monocrystal comprising:
a diamond monocrystal having a principal surface; and
a low-resistance phosphorus-doped diamond epitaxial thin film is grown on a principal surface of the diamond monocrystal having an off-plane with respect to a {111} plane, the diamond monocrystal, the thin-film surface has an off-angle of 0.50° or greater with respect to the {111} plane, a normal vector to the thin film is tilted to an orientation within 40° from a [211] direction with respect to the normal vector to the {111} plane and a specific resistance of the low-resistance phosphorus-doped diamond epitaxial thin film is 100 Ωcm or less at 300 K.

9. The diamond monocrystal having the low-resistance phosphorus-doped diamond epitaxial thin film according to claim 7 or 8, characterized in that
a phosphorus concentration of the low-resistance phosphorus-doped diamond epitaxial thin film is $8.6 \times 10^{19}$ cm$^{-3}$ or higher.

10. The diamond monocrystal having the low-resistance phosphorus-doped diamond epitaxial thin film according to any of claims 5, 7, and 8, characterized in that
a surface roughness of the thin-film surface is 10 nm or higher.

* * * * *